United States Patent
Senda et al.

(10) Patent No.: US 8,250,447 B2
(45) Date of Patent: Aug. 21, 2012

(54) CONVOLUTION ENCODER, ENCODING DEVICE, AND CONVOLUTION ENCODING METHOD

(75) Inventors: Mitsuharu Senda, Tokyo (JP); Youhei Murakami, Kanagawa (JP); Takeshi Nakano, Kanagawa (JP); Masamitsu Nishikido, Kanagawa (JP)

(73) Assignee: Kyocera Corporation, Kyoto (JP)

( * ) Notice: Subject to any disclaimer, the term of this patent is extended or adjusted under 35 U.S.C. 154(b) by 813 days.

(21) Appl. No.: 12/158,966

(22) PCT Filed: Dec. 21, 2006

(86) PCT No.: PCT/JP2006/325477
§ 371 (c)(1),
(2), (4) Date: Mar. 31, 2009

(87) PCT Pub. No.: WO2007/074708
PCT Pub. Date: Jul. 5, 2007

(65) Prior Publication Data
US 2009/0327846 A1 Dec. 31, 2009

(30) Foreign Application Priority Data
Dec. 26, 2005 (JP) .................................. 2005-372592

(51) Int. Cl.
*G06F 11/00* (2006.01)

(52) U.S. Cl. ..................................................... 714/786
(58) Field of Classification Search ............. 714/786
See application file for complete search history.

(56) References Cited

U.S. PATENT DOCUMENTS

| | | | | |
|---|---|---|---|---|
| 6,289,486 B1 * | 9/2001 | Lee et al. | ....................... | 714/788 |
| 6,332,209 B1 * | 12/2001 | Eroz et al. | ..................... | 714/790 |
| 6,334,197 B1 * | 12/2001 | Eroz et al. | ..................... | 714/701 |
| 6,530,059 B1 * | 3/2003 | Crozier et al. | ................ | 714/786 |
| 6,772,391 B1 * | 8/2004 | Shin | .............................. | 714/786 |
| 6,829,305 B2 * | 12/2004 | Kang et al. | ..................... | 375/242 |

(Continued)

FOREIGN PATENT DOCUMENTS

JP 2001-512914 8/2001

(Continued)

OTHER PUBLICATIONS

D. Divsalar et al., "Turbo codes for PCS applications", Communications, 1995, ICC 95 Seattle, Gateway to Globalization, 1995 IEEE International Conference on, 1995, pp. 54-59.

*Primary Examiner* — Marc Duncan
(74) *Attorney, Agent, or Firm* — DLA Piper LLP (US)

(57) ABSTRACT

A bit register is restored to the initial state thereof irrespective of the state of the bit register even when a convolution encoder includes a circular section.

The convolution encoder comprises an input data acquiring section (F11) for acquiring input data; an encoding object data generating section (F10) for generating encoding object data on the basis of the input data; a storage section (M10) for storing data corresponding to the encoding object data; a mod2 adder (S10) for performing convolution processing of the encoding object data on the basis of the data stored in the storage section (M10); and a switching section (F12) for switching at a prescribed timing the encoding object data generated by the encoding object data generating section (F10) from data based on the input data to data based on the data stored in the storage section (M10); wherein the data stored in the storage section (M10) are data obtained as a result of the convolution processing.

5 Claims, 3 Drawing Sheets

20: CIRCULAR CONVOLUTION ENCODER

U.S. PATENT DOCUMENTS

| | | | |
|---|---|---|---|
| 7,281,197 B2 * | 10/2007 | Li | 714/790 |
| 7,343,530 B2 * | 3/2008 | Shin | 714/702 |
| 7,424,070 B2 * | 9/2008 | Le Bars et al. | 375/340 |
| 2002/0087923 A1 * | 7/2002 | Eroz et al. | 714/702 |
| 2003/0051205 A1 * | 3/2003 | Eroz et al. | 714/792 |
| 2005/0091566 A1 * | 4/2005 | Berens et al. | 714/755 |
| 2005/0149816 A1 * | 7/2005 | Eroz et al. | 714/755 |
| 2007/0038922 A1 * | 2/2007 | Kim et al. | 714/776 |

FOREIGN PATENT DOCUMENTS

| | | |
|---|---|---|
| JP | 2004-513532 | 4/2004 |
| JP | 2004-343716 | 12/2004 |
| JP | 2005-294898 | 10/2005 |

* cited by examiner

100: CONVOLUTION ENCODER

110: CIRCULAR CONVOLUTION ENCODER

CONVOLUTION ENCODER, ENCODING DEVICE, AND CONVOLUTION ENCODING METHOD

TECHNICAL FIELD

The present invention relates to a convolution encoder, a communication device, and a convolution encoding method, and particularly relates to a technique for initializing the memory contents of a convolution encoder, a communication device, and a convolution encoding method.

BACKGROUND ART

In some mobile communication systems, maximum likelihood decoding is used for error correction in the communication pathway (see Patent Document 1, for example). Maximum likelihood decoding will be described hereinafter using a specific example.

The convolution encoder 100 shown in FIG. 3 is used for generating a convolution code. The convolution encoder 100 is composed of a bit register G100, a bit register G101, a mod2 adder S100, and a mod2 adder S101. In a mobile communication system, a transmission device for transmitting data, and a receiving device for receiving data both have the convolution encoder 100.

In the convolution encoder 100, when the one-bit bit values (input values) shown in Table 1 are inputted in sequence, the bit value stored in the bit register G100, the bit value stored in the bit register G101, and the outputted bit sequence (output value) each change as shown in Table 1. In the initial state of the convolution encoder 100, the bit values stored by the bit register G100 and the bit register G101 are both assumed to be "0."

TABLE 1

| No | INPUT VALUE (TRANSMISSION DATA) | G100 | G101 | OUTPUT VALUE |
|---|---|---|---|---|
| | (INITIAL STATE) | 0 | 0 | |
| 1 | 1 | 1 | 0 | 1 1 |
| 2 | 1 | 1 | 1 | 1 0 |
| 3 | 0 | 0 | 1 | 1 0 |
| 4 | 0 | 0 | 0 | 1 1 |
| 5 | 1 | 1 | 0 | 1 1 |
| 6 | 0 | 0 | 1 | 0 1 |

The transmission device inputs the transmission data as an input value to the convolution encoder 100. The transmission device then transmits the output value from the convolution encoder 100 to the receiving device. This output value is determined based on a prior input value (two bits in FIG. 3) (this determination is referred to as convolution of the prior input value).

A description will be given hereinafter using a specific example. In this specific example, the transmission device sequentially transmits the first through fourth output values "11," "10," "10," and "11" shown in Table 1 as transmission data. A one-bit error occurs in the third transmission data during communication, and the receiving device receives the bit sequence "11," "10," "11," "11" in sequence.

Table 2 is a table showing the processing performed when the first transmission data are received. The receiving device inputs the acquired input values "0" and "1" to the convolution encoder 100 in the initial state of Table 1. The receiving device then computes the Hamming distance between the received bit sequence (reception value) "11" and the output values "00" and "11" outputted from the convolution encoder 100. The receiving device then acquires as the first reception data the input value "1" corresponding to the data having the smallest value ("11" in this case) in the computed Hamming distance. Since it is assumed that there is no error in the first reception data, the acquired first reception data naturally match the first transmission data.

TABLE 2

| INPUT VALUE | G100 | G101 | OUTPUT VALUE | RECEPTION VALUE | HUMMING DISTANCE |
|---|---|---|---|---|---|
| (INITIAL STATE) | 0 | 0 | | | |
| 0 | 0 | 0 | 0 0 | 1 1 | 2 |
| 1 | 1 | 0 | 1 1 | | 0 |

Table 3 is a table showing the showing the processing performed when the receiving device receives the second transmission data. The receiving device inputs the acquired input values "0" and "1" to the convolution encoder 100 that is in the state (most recent state) corresponding to the input value "1" of Table 2. The receiving device then computes the Humming distance between the reception value "10" and the output values "01" and "10" outputted from the convolution encoder 100.

The receiving device furthermore computes the total Humming distance for each state transition of the output value from the initial state. The output value corresponding to the first reception data in this case is determined to be "11," and the state transition is therefore any of "11" to "01," and "11" to "10." The total Humming distances that correspond to these state transitions are 2 and 0, respectively. The receiving device acquires as the second reception data the input value "1" that corresponds to the smallest value of the total Humming distance ("11" to "10" in this case) among the state transitions. Since it is assumed that there is no error in the second reception data, the acquired second reception data naturally match the second transmission data.

TABLE 3

| INPUT VALUE | G100 | G101 | OUTPUT VALUE | RECEPTION VALUE | HUMMING DISTANCE |
|---|---|---|---|---|---|
| (MOST RECENT STATE) | 1 | 0 | | | |
| 0 | 0 | 1 | 0 1 | 1 0 | 2 |
| 1 | 1 | 1 | 1 0 | | 0 |

Table 4 is a table showing the showing the processing performed when the receiving device receives the third transmission data. The receiving device inputs the acquired input values "0" and "1" to the convolution encoder 100 that is in the state (most recent state) corresponding to the input value "1" of Table 3. The Humming distance is then computed between the reception value "11" and the output values "01" and "10" acquired as a result.

The receiving device furthermore computes the total Humming distance for each state transition of the output value from the initial state. The output values corresponding to the first and second reception data in this case are determined to be "11" and "10," respectively, and the state transition is therefore any of "11" to "10" to "01", and "11" to "10" to "10." The total Humming distances that correspond to these state transitions are 1 and 1, respectively. In this case, since the total Humming distances are the same, the receiving device cannot determine the third reception data.

TABLE 4

| INPUT VALUE | G100 | G101 | OUTPUT VALVE | RECEPTION VALUE | HUMMING DISTANCE |
|---|---|---|---|---|---|
| (MOST RECENT STATE) | 1 | 0 | | | |
| 0 | 0 | 1 | 0 1 | 1 1 | 1 |
| 1 | 1 | 1 | 1 0 | | 1 |

Table 5 is a table showing the showing the processing performed when the receiving device receives the fourth transmission data. Since the third reception data are not determined, the receiving device inputs the acquired input values "0" and "1" to the convolution encoder 100 that is in a plurality of states (most recent state) respectively corresponding to the input values "0" and "1" of Table 4. The receiving device then computes the Humming distance between the reception value "11" and each output value outputted from the convolution encoder 100.

The receiving device furthermore computes the total Humming distance for each state transition of the output value from the initial state. The output values corresponding to the first and second reception data in this case are determined to be "11" and "10," respectively, and the state transition is therefore any of the four transitions that include "11" to "10" to "01" to "11," "11" to "10" to "01" to "00," "11," to "10" to "10" to "10," and "11" to "10" to "10" to "01." The total Humming distances that correspond to these state transitions are 1, 3, 2, and 2 respectively. The receiving device acquires as the third and fourth reception data the third input value "0" and the fourth input value "0" that respectively correspond to the smallest value of the total Humming distance ("11" to "10" to "01" to "11" in this case) among the state transitions. Since it is assumed that there is no error in the second reception data, the acquired second reception data naturally match the second transmission data.

TABLE 5

| INPUT VALUE | G100 | G101 | OUTPUT VALUE | RECEPTION VALUE | HUMMING DISTANCE |
|---|---|---|---|---|---|
| (MOST RECENT STATE) | 0 | 1 | | | |
| 0 | 0 | 0 | 1 1 | 1 1 | 0 |
| 1 | 1 | 0 | 0 0 | | 2 |
| (MOST RECENT STATE) | 1 | 1 | | | |
| 0 | 0 | 1 | 1 0 | 1 1 | 1 |
| 1 | 1 | 1 | 0 1 | | 1 |

Patent Document 1: Japanese Laid-open Patent Application No. 2005-294898

DISCLOSURE OF THE INVENTION

Problems to be Solved by the Invention

As described above, in maximum likelihood decoding, the reception data are determined based on the total Humming distance computed for each state of transition of the output value from the initial state.

The amount of calculation therefore increases when the output value transitions through a large number of states from the initial state. Therefore, a configuration is usually adopted in which a rule is applied in advance so that the convolution encoder 100 returns to the initial state for each frame, for example, and the receiving device need only compute the Humming distance for each frame.

One or a plurality of dummy bits having a prescribed value may be inserted at the end of the transmission data, for example, in order to restore the convolution encoder to the initial state. In the example shown in FIG. 3, the convolution encoder 100 eventually returns to the initial state when "0" is continuously added as the input value.

However, according to the type of convolution encoder, it is sometimes impossible to return to the initial state by insertion of any number of such dummy bits having a prescribed value. A specific example of such a convolution encoder is a circular convolution encoder. FIG. 4 is a diagram showing an example of a circular convolution encoder 110. As shown in FIG. 4, the circular convolution encoder 110 includes a section (circular section) in which the bit value outputted by the latter-stage bit register G111 is inputted to the first-stage bit register G110.

Table 6 shows the value stored in each bit register in the case of each transition in which the circular convolution encoder 110 shown in FIG. 4 makes a transition from a state N that may be any of four types of states (A, B, C, D) to a state N+1 in which a one-bit input value "0" is added, and to a state N+2 in which another one-bit input value "0" is added. As shown in Table 6, in cases other than when the state N is A, the state merely repeats and does not return to the initial state even when the input value "0" is added.

TABLE 6

| STATE N | | INPUT | STATE N + 1 | | INPUT | STATE N + 2 | |
|---|---|---|---|---|---|---|---|
| G110 | G111 | VALUE | G110 | G111 | VALUE | G110 | G111 |
| A | 0 | 0 | 0 | 0 | 0 | 0 | 0 | 0 |
| B | 0 | 1 | 0 | 1 | 0 | 0 | 0 | 1 |
| C | 1 | 0 | 0 | 0 | 1 | 0 | 1 | 0 |
| D | 1 | 1 | 0 | 1 | 1 | 0 | 1 | 1 |

Since the bit value outputted by the latter-stage bit register is thus inputted to the first-stage bit register in the circular section of the circular convolution encoder, insofar as "1" is stored in any of the bit registers, the "1" remains regardless of how many times the input value "0" is inputted. Conversely, in so far as "0" is stored in any of the bit registers, the "0" remains regardless of how many times the input value "1" is inputted. In other words, the circular convolution encoder described above is not restored to the initial state by any inputting of dummy bits having a prescribed value.

Therefore, an object of the present invention is to provide a convolution encoder, a communication device, and a convolution encoding method whereby a bit register can be restored to the initial state regardless of the state of the bit register even when a circular section is included.

Means for Solving the Problem

The convolution encoder according to the present invention for overcoming the abovementioned drawbacks is characterized in comprising input data acquiring means for acquiring input data; encoding object data generating means for generating encoding object data on the basis of the input data; storage means for storing data corresponding to the encoding object data; convolution processing means for performing convolution processing of the encoding object data on the basis of the data stored in the storage means; and switching means for switching at a prescribed timing the encoding object data generated by the encoding object data generating means from data based on the input data to data based on the data stored in the storage means; wherein the data stored in the storage means are data obtained as a result of the convolution processing.

In the convolution encoder according to the present invention, the storage means stores data that correspond to the encoding object data. Encoding object data that correspond to the stored contents of the storage means are inputted to the storage means at a prescribed timing, and the data stored in the storage means are initialized as prescribed data. The bit register can thereby be returned to the initial state regardless of the state of the bit register even when the convolution encoder includes a circular section.

A configuration may be adopted in the abovementioned convolution encoder in which the encoding object data generating means generates the encoding object data so that the data stored in the storage means become prescribed data when the encoding object data are generated based on the data stored in the storage means.

The data stored in the storage means can thereby be made into prescribed data through the use of the encoding object data.

A configuration may also be adopted in the abovementioned convolution encoder in which the convolution processing includes prescribed computation processing of the encoding object data and the data stored in the storage means, and the encoding object data generating means generates the encoding object data so that the data obtained as a result of the prescribed computation processing become prescribed data when the encoding object data are generated based on the data stored in the storage means.

Since the encoding object data can thereby be generated so that the data obtained as a result of the prescribed computation processing become prescribed data, the prescribed data can be stored in the storage means for storing the results of convolution processing.

The communication device according to the present invention is characterized in comprising input data acquiring means for acquiring input data; encoding object data generating means for generating encoding object data on the basis of the input data; storage means for storing data corresponding to the encoding object data; convolution processing means for performing convolution processing of the encoding object data on the basis of the data stored in the storage means; and switching means for switching at a prescribed timing the encoding object data generated by the encoding object data generating means from data based on the input data to data based on the data stored in the storage means; wherein the data stored in the storage means are data obtained as a result of the convolution processing.

The convolution encoding method according to the present invention is characterized in comprising an input data acquiring step of acquiring input data; an encoding object data generating step of generating encoding object data on the basis of the input data; a storage step of storing data corresponding to the encoding object data in the storage means; a convolution processing step of performing convolution processing of the encoding object data on the basis of the data stored in the storage step; and a switching step of switching at a prescribed timing the encoding object data generated in the encoding object data generating step from data based on the input data to data based on the data stored in the storage step; wherein the data stored in the storage means are data obtained as a result of the convolution processing.

BEST MODE FOR CARRYING OUT THE INVENTION

Embodiments 1 and 2 of the present invention will each be described with reference to the drawings.

[Embodiment 1]

Figure 1:
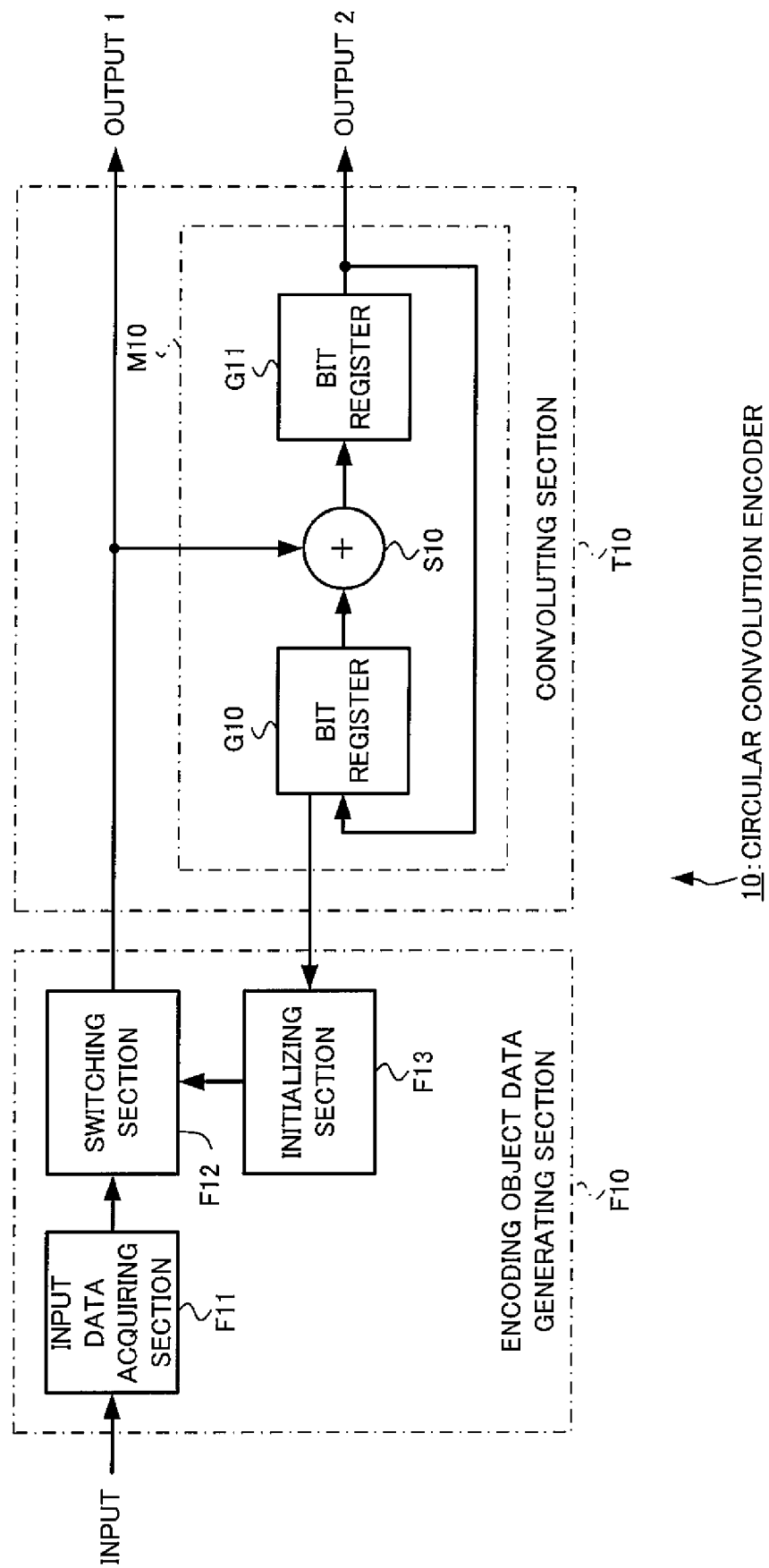
FIG. 1 is a diagram showing the circuit structure and functional blocks of the circular convolution encoder according to Embodiment 1 of the present invention.

FIG. 1 is a diagram showing the circuit structure and functional blocks of the circular convolution encoder 10 according to Embodiment 1. The circular convolution encoder 10 is used for convolution encoding, and decoding of convolution encoding in a base station device and mobile station device that are communication devices included in a mobile communication system.

As shown in FIG. 1, the circular convolution encoder 10 is composed of an encoding object data generating section F10 and a convoluting section T10. The encoding object data generating section F10 furthermore includes an input data acquiring section F11, a switching section F12, and an initializing section F13. The convoluting section T10 furthermore includes a storage section M10.

The base station device and the mobile station device transmit and receive communication data in frame units, and when transmission of one frame is completed, initialization is performed for restoring the convoluting section T10 to the initial state. In this arrangement, the convoluting section T10 is initialized by setting all of the data stored in one or a plurality of bit registers included in the convoluting section T10 to "0." The bit registers will be described in detail hereinafter. The organization for achieving this initialization will be described in detail hereinafter.

The encoding object data generating section F10 generates encoding object data on the basis of input data that are inputted to the circular convolution encoder 10. The specific organization for generating the encoding object data will be described hereinafter.

The input data acquiring section F11 acquires the input data of the circular convolution encoder 10 and generates encoding object data that are bit sequences composed of a plurality of bits constituting the input data. The input data acquiring section F11 then outputs the generated encoding object data sequentially and one bit at a time to the switching section F12. The encoding object data in the communication device on the transmission side are the communication data. The encoding object data in the communication device on the receiving side are bit sequences in which "0" and "1" appear in alternating fashion.

The switching section F12 inputs to the convoluting section T10 the bit value of each bit sequentially inputted from the input data acquiring section F11 at the timing at which the communication data are transmitted and received. When the convoluting section T10 is initialized, the switching section F12 inputs to the convoluting section T10 the bit value of each bit sequentially inputted from the initializing section F13 described hereinafter.

The convoluting section T10 will next be described.

The encoding object data inputted from the encoding object data generating section F10 are outputted by the convoluting section T10 without modification as the output 1 of the circular convolution encoder 10, and are inputted to the storage section M10 by the convoluting section T10.

The storage section M10 stores data that correspond to the encoding object data inputted from the encoding object data generating section F10. The encoding object data are convoluted based on the data stored in the storage section M10, and the data obtained as a result of the convolution are designated as the output 2 of the circular convolution encoder 10. The data stored by the storage section M10 are also data obtained as a result of the convolution. The specific configuration of the storage section M10 will be described in detail hereinafter.

The storage section M10 is composed of a bit register G10, a bit register G11, and a mod2 adder S10.

The bit register G10 and the bit register G11 are provided with input and output, respectively, and store the bit value of a single inputted bit and output the stored bit value when the bit value of the single bit is inputted. The bit value outputted from the bit register G10 is inputted to the mod2 adder S10. The bit value outputted from the bit register G11 is inputted to the bit register G10, and becomes the output 2 of the circular convolution encoder 10.

The mod2 adder S10 performs prescribed computation processing, i.e., mod2 adding (exclusive OR computation processing) of the data stored in the bit register G10 and the encoding object data inputted to the storage section M10, and inputs the results to the bit register G11.

The storage section M10 stores in the bit register G10 and the bit register G11 the data that correspond to the encoding object data inputted from the encoding object data generating section F10. The encoding object data are convoluted using the mod2 adder S10 on the basis of the data stored in the bit register G10 and the bit register G11, and the data obtained as a result are outputted as the output 2 of the circular convolution encoder 10. As a result, the data stored in the bit register G10 and the bit register G11 are that data obtained as a result of convolution processing.

The specific organization for initializing the convoluting section T10 will next be described.

The initializing section F13 generates encoding object data on the basis of the data stored in the storage section M10. Specifically, the initializing section F13 generates encoding object data so that the data stored in the storage section M10 become prescribed data. More specifically, the initializing section F13 generates encoding object data so that the data (i.e., the data stored in the storage section M10) obtained as a result of the prescribed computation processing described above become prescribed data. The initializing section F13 then outputs the generated encoding object data sequentially and one bit at a time to the switching section F12.

A specific example of the encoding object data generated by the initializing section F13 will be described. In this example, the data stored in the storage section M10 are first described as being in any of the states A through D shown below. The state will be referred to as the state N. Table 7 shows the data stored in the storage section M10 in each of the abovementioned states A through D in the state N.

TABLE 7

| | STATE N | |
|---|---|---|
| | G10 | G11 |
| A | 0 | 0 |
| B | 0 | 1 |

TABLE 7-continued

| | STATE N | |
|---|---|---|
| | G10 | G11 |
| C | 1 | 0 |
| D | 1 | 1 |

The initializing section F13 generates encoding object data so that the data obtained as a result of the mod2 adding become prescribed data ("0" in this case). Specifically, the initializing section F13 performs mod2 adding of the abovementioned prescribed data and the data stored in the bit register G10, and designates the resultant data as encoding object data. In the states A through D in the state N, the initializing section F13 designates the bit values shown below as the encoding object data. Table 8 shows the encoding object data of each of the states A through D in the state N.

TABLE 8

| | ENCODING OBJECT DATA |
|---|---|
| A | 0 |
| B | 0 |
| C | 1 |
| D | 1 |

When the encoding object data generated in this manner are inputted to the storage section M10, the state N transitions to the next state N+1. Table 9 shows the data stored in the storage section M10 in each of the states A through D in the state N+1.

TABLE 9

| | STATE N+1 | |
|---|---|---|
| | G10 | G11 |
| A | 0 | 0 |
| B | 1 | 0 |
| C | 0 | 0 |
| D | 1 | 0 |

In the state N+1, the initializing section F13 again performs mod2 adding of the abovementioned prescribed data and the data stored in the bit register G10, and designates the resultant data as encoding object data. In each state A through D in the state N+1, the initializing section F13 designates the bit values shown below as the encoding object data. Table 10 shows the encoding object data of each of the states A through D in the state N+1.

TABLE 10

| | ENCODING OBJECT DATA |
|---|---|
| A | 0 |
| B | 1 |
| C | 0 |
| D | 1 |

When the encoding object data generated in this manner are inputted to the storage section M10, the state N+1 transitions to the next state N+2. Table 11 shows the data stored in the storage section M10 in each of the states A through D in the state N+2.

TABLE 11

| | STATE N + 2 | |
| | G10 | G11 |
|---|---|---|
| A | 0 | 0 |
| B | 0 | 0 |
| C | 0 | 0 |
| D | 0 | 0 |

In the state N+2, all of the data stored in the one or a plurality of bit registers included in the convoluting section T10 are "0" in each of the states A through D. In other words, initialization is completed in all of the abovementioned states A through D. Specifically, the initializing section F13 can initialize the convoluting section T10 by generating at most two bits of encoding object data on the basis of the data stored in the bit register G10.

As described above, through the use of the circular convolution encoder 10, since the storage section M10 stores data that correspond to the encoding object data, and the encoding object data generating section F10 inputs encoding object data that correspond to the stored contents of the storage section M10 at the time of initialization, the data stored in the storage section M10 can be made into prescribed data. Specifically, the circular convolution encoder 10 makes it possible to restore the bit registers to the initial state regardless of the state of the bit registers.

[Embodiment 2]

Figure 2:
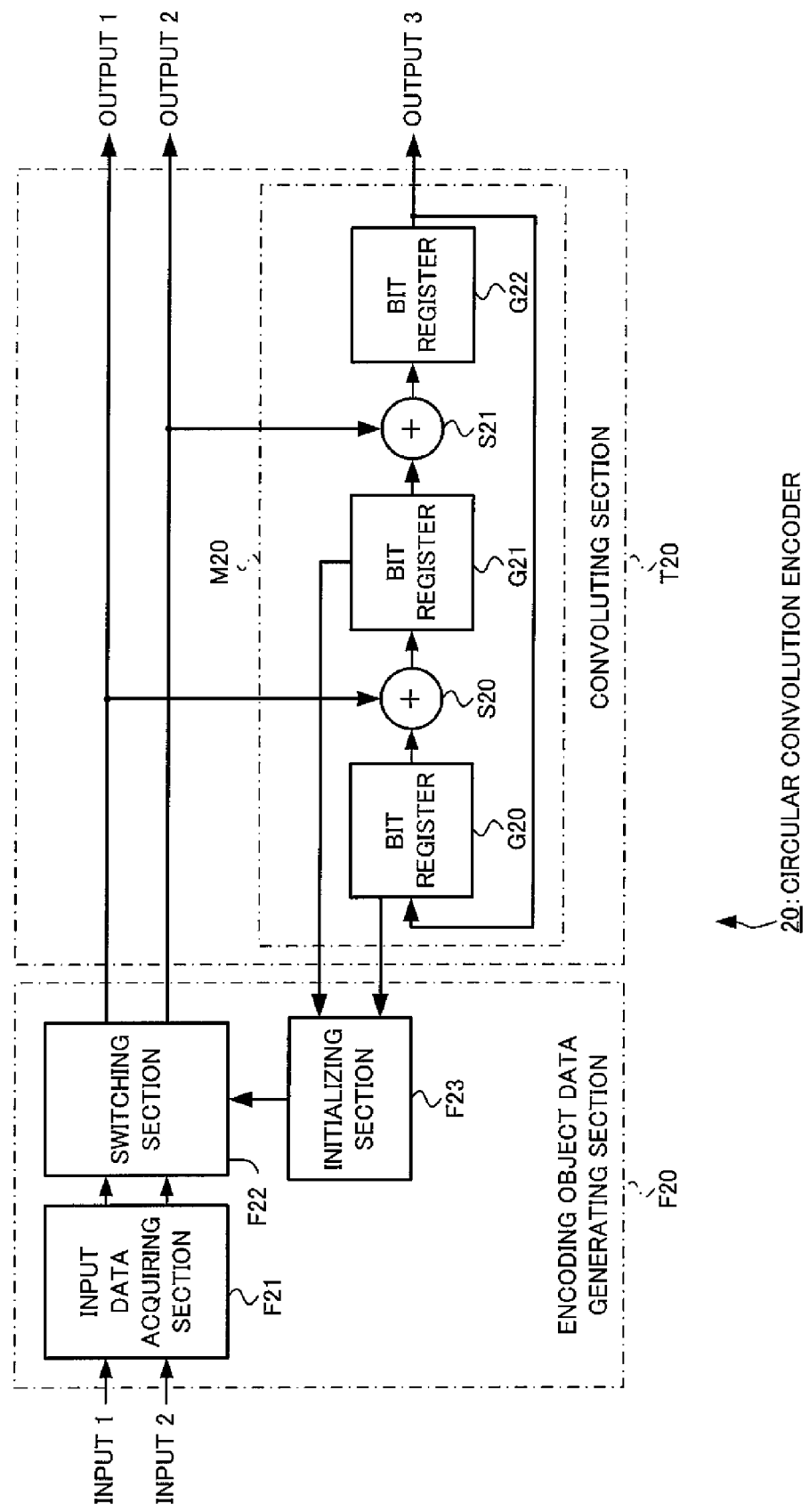
FIG. 2 is a diagram showing the circuit structure and functional blocks of the circular convolution encoder according to Embodiment 2 of the present invention.
Figure 3:
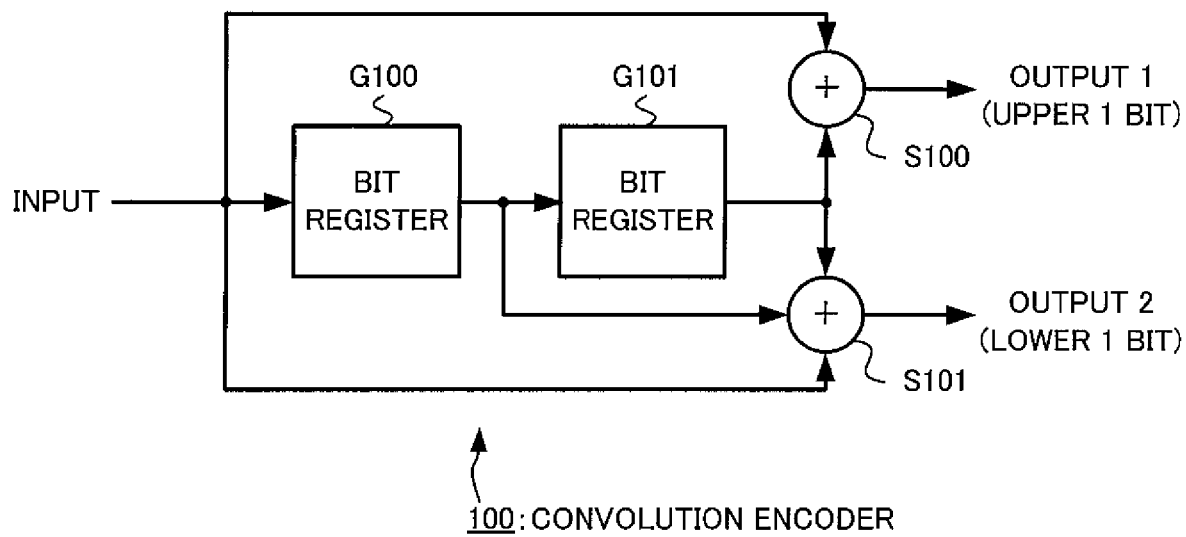
FIG. 3 is a diagram showing a convolution encoder according to the prior art of the present invention.
Figure 4:
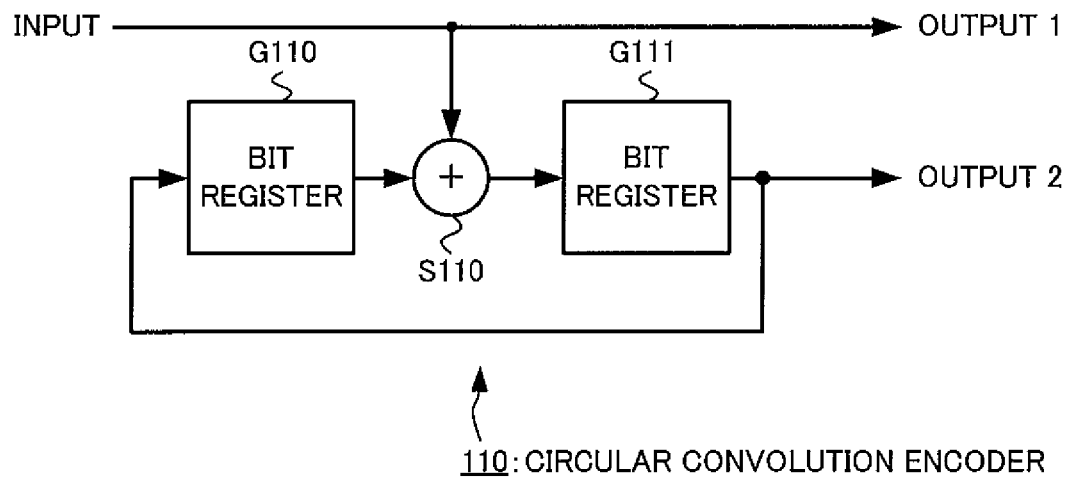
FIG. 4 is a diagram showing a circular convolution encoder according to the prior art of the present invention.

FIG. 2 is a diagram showing the circuit structure and functional blocks of the circular convolution encoder 20 according to Embodiment 2. The circular convolution encoder 20 is also used for convolution encoding, and decoding of convolution encoding in a base station device and mobile station device that are communication devices included in a mobile communication system, in the same manner as the circular convolution encoder 10.

As shown in FIG. 2, the circular convolution encoder 20 is composed of an encoding object data generating section F20 and a convoluting section T20. The encoding object data generating section F20 furthermore includes an input data acquiring section F21, a switching section F22, and an initializing section F23. The convoluting section T20 furthermore includes a storage section M20.

The circular convolution encoder 20 differs from the circular convolution encoder 10 in that there are two input systems and three output systems, and with respect to the detailed structure of the storage section M20. The description given hereinafter will focus on these differing aspects.

The input data acquiring section F21 acquires the input data of the circular convolution encoder 10 from two systems (input 1 system and input 2 system). Such input data are used in transmission of communication data in two-bit units, for example. Based on the input data from the two systems, the input data acquiring section F21 generates encoding object data for each system that are formed by bit sequences composed of a plurality of bits. The input data acquiring section F21 then outputs the generated two-system encoding object data sequentially and one bit at a time to the switching section F22.

For each system, the switching section F22 inputs to the sequential convoluting section T20 the bit value of each bit sequentially inputted from the systems in the input data acquiring section F21 at the timing at which the communication data are transmitted and received. When the convoluting section T20 is initialized, the switching section F22 inputs to the sequential convoluting section T20 for each system the bit value of each bit sequentially inputted in the same manner from the two systems in the initializing section F23 described hereinafter.

The convoluting section T20 will next be described.

The encoding object data of the two systems that are inputted from the encoding object data generating section F20 are outputted by the convoluting section T20 without modification as the outputs 1 and 2 of the circular convolution encoder 20, and are inputted to the storage section M20 by the convoluting section T20.

The storage section M20 stores data that correspond to the encoding object data of the two systems and are inputted from the encoding object data generating section F20. The encoding object data are convoluted based on the data stored in the storage section M20, and the data obtained as a result of the convolution are designated as the output 3 of the circular convolution encoder 20. The data stored by the storage section M20 are also data obtained as a result of the convolution. The specific configuration of the storage section M20 will be described in detail hereinafter.

The storage section M20 is composed of a bit register G20, a bit register G21, a bit register G22, a mod2 adder S20, and a mod2 adder S21.

The bit register G20, the bit register G21, and the bit register G22 are provided with input and output, respectively, and store the bit value of a single inputted bit and output the stored bit value when the bit value of the single bit is inputted. The bit value outputted from the bit register G20 is inputted to the mod2 adder S20. The bit value outputted from the bit register G21 is inputted to the mod2 adder S21. The bit value outputted from the bit register G22 is inputted to the bit register G20, and becomes the output 3 of the circular convolution encoder 20.

The mod2 adder S20 performs the abovementioned prescribed computation processing (i.e., mod2 adding) of the data stored in the bit register G20, and the input data of the input 1 system among the encoding object data of the two systems that are inputted to the storage section M20. The mod2 adder S20 then inputs the computed results to the bit register G21.

The mod2 adder S21 performs the abovementioned prescribed computation processing of the data stored in the bit register G21, and the input data of the input 2 system among the encoding object data of the two systems that are inputted to the storage section M20. The mod2 adder S21 then inputs the computed results to the bit register G22.

The storage section M20 stores in the bit registers G20 through G22 the data that correspond to the encoding object data inputted from the encoding object data generating section F20. The encoding object data are convoluted by the mod2 adder S20 and the mod2 adder S21 on the basis of the data stored in the bit registers G20 through G22. The data obtained as a result are outputted as the output 3 of the circular convolution encoder 20. As a result, the data stored in the bit registers G20 through G22 are the data obtained as a result of convolution processing.

The specific organization for initializing the convoluting section T20 will next be described.

The initializing section F23 generates encoding object data of the two systems on the basis of the data stored in the storage section M20. Specifically, the initializing section F23 generates encoding object data of the two systems so that the data stored in the storage section M20 become prescribed data. More specifically, the initializing section F23 generates encoding object data so that the data (i.e., the data stored in the storage section M20) obtained as a result of the prescribed computation processing described above become prescribed data. The initializing section F23 then outputs the generated encoding object data sequentially and one bit at a time to the switching section F22.

A specific example of the encoding object data generated by the initializing section F23 will be described. In this example, the data stored in the storage section M20 are first described as being in any of the states A through H shown below. The state will be referred to as the state N. Table 12 shows the data stored in the storage section M20 in each of the abovementioned states A through H in the state N.

TABLE 12

| | STATE N | | |
|---|---|---|---|
| | G20 | G21 | G22 |
| A | 0 | 0 | 0 |
| B | 0 | 0 | 1 |
| C | 0 | 1 | 0 |
| D | 0 | 1 | 1 |
| E | 1 | 0 | 0 |
| F | 1 | 0 | 1 |
| G | 1 | 1 | 0 |
| H | 1 | 1 | 1 |

The initializing section F23 generates encoding object data so that all of the data obtained as a result of the mod2 adding by the mod2 adder S20 and the mod2 adder S21 become prescribed data ("0" in this case). Specifically, the initializing section F23 designates as encoding object data of the input 1 system the data obtained as a result of mod2 adding of the abovementioned prescribed data and the data stored in the bit register G20, and designates as encoding object data of the input 2 system the data obtained as a result of mod2 adding of the abovementioned prescribed data and the data stored in the bit register G21. In the states A through H in the state N, the initializing section F23 designates the bit values shown below as the encoding object data. Table 13 shows the encoding object data of each of the states A through H in the state N.

TABLE 13

| | ENCODING OBJECT DATA (INPUT 1 SYSTEM) | ENCODING OBJECT DATA (INPUT 2 SYSTEM) |
|---|---|---|
| A | 0 | 0 |
| B | 0 | 0 |
| C | 0 | 1 |
| D | 0 | 1 |
| E | 1 | 0 |
| F | 1 | 0 |
| G | 1 | 1 |
| H | 1 | 1 |

When the encoding object data generated in this manner are inputted to the storage section M20, the state N transitions to the next state N+1. Table 14 shows the data stored in the storage section M20 in each of the states A through H in the state N+1.

TABLE 14

| | STATE N + 1 | | |
|---|---|---|---|
| | G20 | G21 | G22 |
| A | 0 | 0 | 0 |
| B | 1 | 0 | 0 |
| C | 0 | 0 | 0 |
| D | 1 | 0 | 0 |
| E | 0 | 0 | 0 |
| F | 1 | 0 | 0 |
| G | 0 | 0 | 0 |
| H | 1 | 0 | 0 |

In the state N+1, the initializing section F23 again performs mod2 adding of the abovementioned prescribed data and the data stored in the bit register G20, designates the resultant data as encoding object data of the input 1 system, and sets "0" for the encoding object data of the input 2 system. In the transition from the state N to the state N+1, the data obtained as a result of the mod2 adding by the mod2 adder S21 become the abovementioned prescribed data, and the data are inputted to the bit register G21. The data stored in the bit register G21 therefore always become prescribed data. In each state A through H in the state N+1, the initializing section F23 designates the bit values shown below as the encoding object data. Table 15 shows the encoding object data of each of the states A through H in the state N+1.

TABLE 15

| | ENCODING OBJECT DATA (INPUT 1 SYSTEM) | ENCODING OBJECT DATA (INPUT 2 SYSTEM) |
|---|---|---|
| A | 0 | 0 |
| B | 1 | 0 |
| C | 0 | 0 |
| D | 1 | 0 |
| E | 0 | 0 |
| F | 1 | 0 |
| G | 0 | 0 |
| H | 1 | 0 |

When the encoding object data generated in this manner are inputted to the storage section M20, the state N+1 transitions to the next state N+2. Table 16 shows the data stored in the storage section M20 in each of the states A through H in the state N+2.

TABLE 16

| | STATE N + 2 | | |
|---|---|---|---|
| | G20 | G21 | G22 |
| A | 0 | 0 | 0 |
| B | 0 | 0 | 0 |
| C | 0 | 0 | 0 |
| D | 0 | 0 | 0 |
| E | 0 | 0 | 0 |
| F | 0 | 0 | 0 |
| G | 0 | 0 | 0 |
| H | 0 | 0 | 0 |

In the state N+2, all of the data stored in the one or a plurality of bit registers included in the convoluting section T20 are "0" in each of the states A through H. In other words, initialization is completed in all of the abovementioned states A through H. Specifically, the initializing section F23 can initialize the convoluting section T20 by generating at most two bits of encoding object data on the basis of the data stored in the bit register G20, and generating at most one bit of encoding object data on the basis of the data stored in the bit register G21.

As described above, through the use of the circular convolution encoder 20, since the storage section M20 stores data that correspond to the encoding object data, and the encoding object data generating section F20 inputs encoding object data that correspond to the stored contents of the storage section M20 at the time of initialization, the data stored in the storage section M20 can be made into prescribed data. Specifically, even when there is a plurality of input systems or output systems as in the circular convolution encoder 20, the bit registers can be restored to the initial state regardless of the state of the bit registers.

The invention claimed is:

1. A convolution encoder characterized in comprising:
   encoding object data generating means for generating bit values on the basis of input data;
   first and second bit registers for storing a bit value of a single inputted bit and outputting a stored bit value respectively when the bit value of the single bit is inputted;
   a first adder for processing an exclusive OR operation on a bit value from the encoding object data generating means and the bit value outputted from the first bit register; and
   a second adder for processing an exclusive OR operation on a bit value from the encoding object data generating means and the bit value outputted from the second bit register,
   wherein the encoding object data generating means switches at a prescribed timing the bit values for inputting to the first and second adders from bit values on the basis of the input data to bit values on the basis of the bit values stored in the first and second bit registers respectively.

2. The convolution encoder according to claim 1, wherein the encoding object data generating means generates bit values so that the bit values stored in the first and second bit registers become prescribed values when the encoding object data generating means generates based on the bit values stored in the first and second bit registers.

3. The convolution encoder according to claim 2,
   wherein the encoding object data generating means inputs bit values stored in the first and second bit registers to the first and second adders respectively when the encoding object data generating means generates based on the bit values stored in the first and second bit registers.

4. A communication device performing as a base station or a mobile station and comprising:
   a convolution encoder including:
   encoding object data generating means for generating bit values on the basis of input data;
   first and second bit registers for storing a bit value of a single inputted bit and outputting a stored bit value respectively when the bit value of the single bit is inputted;
   a first adder for processing an exclusive OR operation on a bit value from the encoding object data generating means and the bit value outputted from the first bit register; and
   a second adder for processing an exclusive OR operation on a bit value from the encoding object data generating means and the bit value outputted from the second bit register,
   wherein the encoding object data generating means switches at a prescribed timing the bit values for inputting to the first and second adders from bit values on the basis of the input data to bit values on the basis of the bit values stored in the first and second bit registers respectively.

5. A convolution encoding method for driving a convolution encoder including first and second bit registers for storing a bit value of a single inputted bit and outputting a stored bit value respectively when the bit value of the single bit is inputted; a first adder for processing an exclusive OR operation on a bit value inputted to the first adder and the bit value outputted from the first bit register; and a second adder for processing an exclusive OR operation on a bit value inputted to the second adder and the bit value outputted from the second bit register,
   the convolution encoding method comprising:
   an encoding object data generating step of generating bit values on the basis of input data;
   a switching step of switching at a prescribed timing the bit values for inputting to the first and second adders from bit values on the basis of the input data to bit values on the basis of the bit values stored in the first and second bit registers respectively.

* * * * *